United States Patent
Howe et al.

(10) Patent No.: US 8,659,309 B2
(45) Date of Patent: Feb. 25, 2014

(54) MIXED SIGNAL INTEGRATED CIRCUIT, WITH BUILT IN SELF TEST AND METHOD

(76) Inventors: Scott Lawrence Howe, Campbellville (CA); Chris Ouslis, Kleinberg, CA (US)

(*) Notice: Subject to any disclaimer, the term of this patent is extended or adjusted under 35 U.S.C. 154(b) by 596 days.

(21) Appl. No.: 12/938,963

(22) Filed: Nov. 3, 2010

(65) Prior Publication Data
US 2011/0181312 A1    Jul. 28, 2011

Related U.S. Application Data

(60) Provisional application No. 61/298,295, filed on Jan. 26, 2010.

(51) Int. Cl.
*G01R 31/3187* (2006.01)
(52) U.S. Cl.
USPC .................................................. 324/750.3

(58) Field of Classification Search
USPC ................ 324/750.01–750.3, 762.01–762.1; 257/48; 438/14–18
See application file for complete search history.

(56) References Cited

U.S. PATENT DOCUMENTS 5,659,312 A * 8/1997 Sunter et al. .................. 341/120

* cited by examiner

*Primary Examiner* — Tung X Nguyen
(74) *Attorney, Agent, or Firm* — Trellis IP Law Group, PC

(57) ABSTRACT

A mixed signal integrated circuit includes a signal source to inject a test signal into the signal path of the mixed signal integrated circuit, a feedback loop and a signal comparator for determining characteristics of a resulting signal. Conveniently, the test signal may be a digital signal injected upstream of a digital to analog converter (DAC). By connecting the output to the input, the entirety of the signal path and the majority of the integrated circuit may be tested. The signal may be condition or manipulated in the feedback loop. By incorporating test signal generation and measurement into the mixed signal integrated circuit, the cost of test equipment and the test duration for each device under test may be reduced.

9 Claims, 2 Drawing Sheets

MIXED SIGNAL INTEGRATED CIRCUIT, WITH BUILT IN SELF TEST AND METHOD

CROSS-REFERENCE TO RELATED APPLICATIONS

The present application claims priority under 35 U.S.C. §119(e) from the provisional U.S. patent application Ser. No. 61/298,295 filed on Jan. 26, 2010, entitled "MIXED SIGNAL INTEGRATED CIRCUIT, WITH BUILT IN SELF TEST AND METHOD" the contents of which are incorporated herein by reference.

FIELD OF THE INVENTION

The present invention relates generally to integrated circuits, and more particularly to integrated circuits that digitally process analog signals (referred to as mixed signal circuits) and self-tests therefor.

BACKGROUND OF THE INVENTION

Modern electronic circuit design relies heavily on the use of digital components. Digital circuits can typically be designed, integrated and manufactured with greater predictability and accuracy than analog circuits. Moreover, modern fabrication techniques make the production of digital circuits straightforward and relatively cost-effective.

Nevertheless, certain electronic applications still require the processing of analog signals. For example, audio and video processing often relies on the processing of a received analog signal and the provision of an analog output signal.

To take advantage of digital design and fabrication techniques, such circuits may be implemented using a mixed digital/analog design. Typically, in such mixed circuits, received analog signals are converted to digital format. Signal processing is performed in the digital domain and the resulting processed digital signal is converted again to an analog output. In this way, the predictability and fabrication ease of digital signal processing cores may be combined with conventional digital to analog and analog to digital converters in order to perform sophisticated signal processing on analog signals.

Integrated mixed signal circuits are, for example, commonly used in television and radio receivers, audio devices, cellular (in particular 3G) telephone, and in power over Ethernet applications. A particular example of a mixed signal circuit is contained in U.S. Provisional Patent Application No. 61/294,092 that discloses a television tuner, for use in a television, personal video recorder, set-top box or the like.

Such mixed signal designs must often be tested to ensure design and/or production quality. To this end, such circuits may be superficially tested, by applying power and measuring a response to an input signal. More sophisticated tests may be performed by applying a known analog signal to the circuit input and measuring the quality and characteristics of the analog output.

Naturally, superficial testing may not diagnose imperfections. The more sophisticated tests require relatively complex analog signal detection equipment and an analog source. This makes integration of testing circuitry as part of the mixed signal integrated circuit cumbersome.

Accordingly, there is a need for an improved method of testing mixed signal circuits and, more particularly, integrating components allowing on-chip testing and self-testing of such circuits.

SUMMARY OF THE INVENTION

Exemplary of an embodiment of the present invention, a mixed signal integrated circuit includes a signal source to inject a test signal into the signal path of the mixed signal integrated circuit, a feedback loop and a signal comparator for determining characteristics of a resulting signal. Conveniently, the test signal may be a digital signal injected upstream of a digital to analog converter (DAC). By connecting the output to the input, the entirety of the signal path and the majority of the integrated circuit may be tested. The signal may be conditioned or manipulated in the feedback loop.

In an embodiment, the integrated circuit may be a component of a television tuner. The injected signal may be a two-tone test signal that may be mixed with a carrier. Characteristics of the mixed signal may be assessed by a signal comparator.

In an embodiment, a mixed signal integrated circuit includes an analog to digital converter (ADC); a digital signal processing (DSP) core; and a DAC. The integrated circuit further includes a built-in test circuit that interconnects the output of the integrated circuit to its input, in feedback, and injects a digital test signal downstream of the DSP core. A resulting digital signal generated as a result of the injected digital test signal is compared downstream of the ADC.

Signal to noise (SNR), distortion, power, and other metrics of the resulting digital signal may be measured. The signal may be injected for a test interval to test the integrated circuit. Test signal(s) may be generated from stored representations of sine-waves; expected signals and expected values may also be stored and/or loaded onto the integrated circuit.

Conveniently, by incorporating test signal generation and measurement into the mixed signal integrated circuit, the cost of test equipment and the test duration for each device under test [DUT] may be reduced.

In accordance with an aspect of the present invention, there is provided a mixed signal integrated circuit comprising: an input; an output; an analog to digital converter (ADC) to convert an analog signal derived from a signal at the input to a digital signal; a digital signal processing (DSP) core for receiving the digital signal and to provide a digitally processed digital signal; a digital to analog converter (DAC) to convert the digitally processed digital signal to an analog signal for provision to the output; a self test circuit comprising: a digital signal generator for generating a digital test signal to be provided to the DAC; a feedback loop to selectively connect the output to the input, in feedback; and a digital signal comparator to compare a digital signal downstream of the ADC to an expected digital signal, resulting from the digital test signal.

In accordance with another aspect of the present invention, there is provided a method of performing a test of a mixed signal integrated circuit. The mixed signal integrated circuit comprises: an input; an output; an analog to digital converter (ADC) to convert an analog signal derived from a signal at the input to a digital signal; a digital signal processing (DSP) core for receiving the digital signal to provide a digitally processed signal; a digital to analog converter (DAC) to convert the digitally processed signal to an analog signal for provision to the output; the method comprising: connecting the output in feedback with the input; injecting a digital test signal downstream of said DSP core; comparing a resulting digital signal generated as a result of the digital test signal, downstream of the ADC to an expected digital signal.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
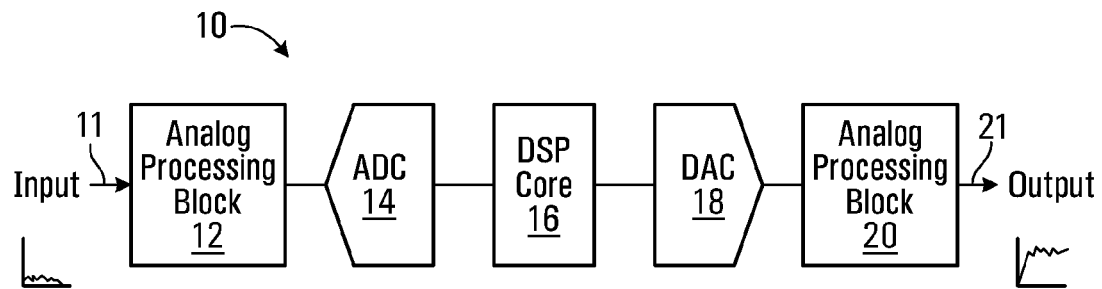
FIG. 1 is a simplified schematic diagram of a conventional mixed (i.e. analog and digital) signal integrated circuit.

FIG. 1 illustrates a conventional mixed signal integrated circuit 10. As illustrated, integrated circuit 10 includes an analog processing block 12, receiving an analog input signal at input 11, and providing a processed analog output signal to an analog to digital converter (ADC) 14. The output of ADC 14 feeds a digital signal processing (DSP) core 16, the output of DSP core 16 is provided to a digital to analog converter (DAC) 18 that provides analog output to a final analog processing block 20.

In operation, an analog input signal is provided to analog processing block 12. Analog processing block 12 may pre-process the analog signal by, for example, filtering, amplifying, or otherwise manipulating the analog signal in the analog domain. The output of analog processing block 12 is provided to ADC 14 that provides a digital equivalent of the processed analog signal. The digital equivalent is provided to digital signal processing (DSP) core 16.

DSP core 16 may include any variety of conventional digital signal processing blocks. DSP core 16 may, for example, include finite impulse response filters (FIRs), infinite impulse response filters (IIRs), interpolators and the like, in order to perform desired digital signal processing on a received signal. The output of DSP core 16 is provided to DAC 18, which is typically complementary to ADC 14. DAC 18 reconstructs an analog signal from the now processed digital signal. The output of DAC 18 is provided to a final analog processing block 20 that may post process the digitally processed signal in the analog domain, and provide an analog output signal at output 21.

As will be appreciated, the testing of the design and manufacture of integrated circuit 10 typically involves the application of an analog input signal to input 11 of analog processing block 12 and a comparison of the produced analog output signal provided by analog processing block 20 at output 21 to a desired or expected output signal.

Figure 2:
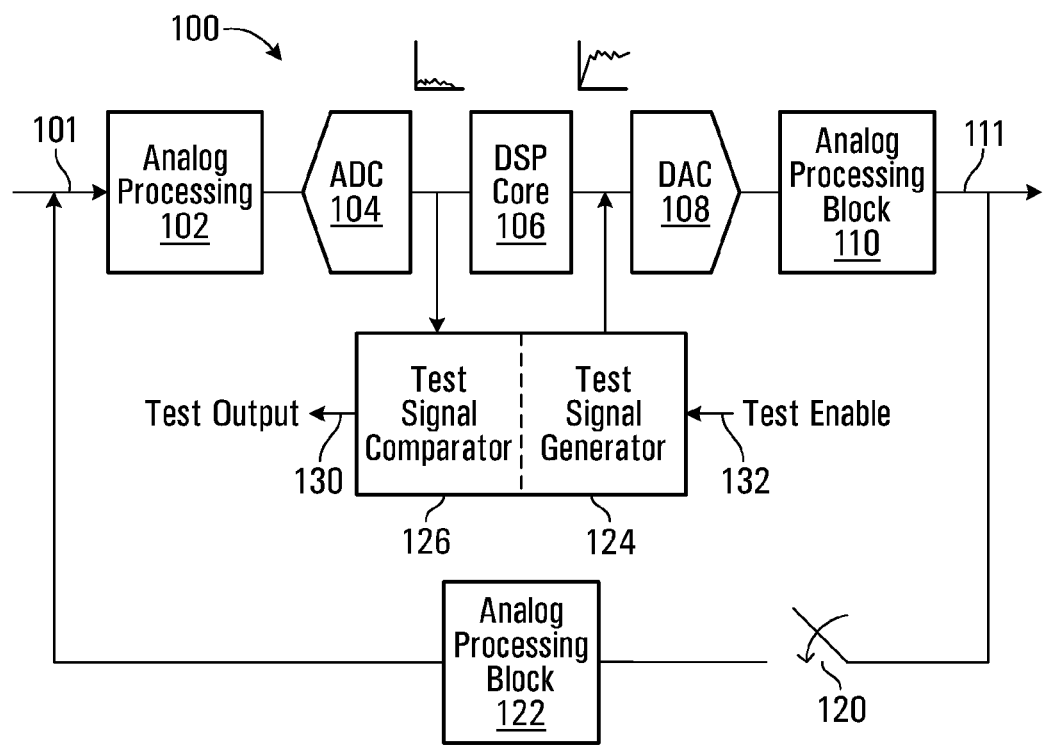
FIG. 2 is a simplified schematic diagram of a mixed signal integrated circuit, exemplary of an embodiment of the present invention.

FIG. 2 accordingly illustrates a mixed signal analog/digital circuit 100, exemplary of an embodiment of the present invention. As illustrated in FIG. 2, circuit 100, like conventional circuit 10 (FIG. 1) includes an analog processing block 102 that receives an input analog signal at input 101.

Analog processing block 102 may be formed of a variety of active and passive analog components, and may for example, act as one or more of an analog mixer, filter, demultiplexer, amplifier, automatic gain control circuit, and the like. The analog output of analog processing block 102 is provided to an ADC 104 that feeds a DSP core 106. The output of DSP core 106 feeds a DAC 108 that in turn, feeds a further analog processing block 110, that post-processes the signal output by DSP core 106 in the analog domain, to provide the desired analog output signal at output 111.

ADC 104 may be any suitable A/D converter, chosen with suitable sampling rates, and bit depth to provide one more digital signal streams to DSP core 106. ADC 104 may for example be a linear or non-linear ADC, with any desirable resolution, and sampling rate, and may be chosen to avoid spectral aliasing, and provide dither if desirable. ADC 104 may over or under-sample the analog signal. In the event that analog signal has been demultiplexed into several analog signals, ADC 104 may be formed of multiple A/D converters. The digital output of ADC 104 may have any desirable bit-depth. For example, ADC 104 may output a single digital bit stream, or multiple n-bit streams. ADC 104 may be clocked by an external clock (not shown) that may be the same as, or phase locked to other clocks used to clock circuit 100.

DSP core 106 receives the one or more digital streams provided by ADC 104. DSP core 106 like DSP core 16 may include any variety of conventional digital signal processing blocks, such as for example, FIR filters, IIR filters, interpolators and the like, in order to perform desired digital signal processing on a received signal. DSP core 106 may further include multiplexers, mixers, and other functional blocks operating in the digital domain. DSP core 106 may also be clocked by the clock clocking ADC 104, or a clock derived (e.g. phase locked, and a frequency multiple thereof) from that clock. DSP 106, in turn outputs a digitally processed signal, at a rate determined by this clock.

DAC 108 is complementary to ADC 104 and DSP core 106, and receives one or more digital streams provided by DSP core 106 at its clock rate. DAC 108 performs the opposite operation of ADC 104. As such, DAC 108 may have any desirable resolution, sampling frequency, and may be formed in any manner understood by those of ordinary skill. For example, DAC 108 may use pulse width modulation, over-sampling, or interpolation, or a resistive ladder to form an analog output signal, proportional to a digital input value. Again, DAC 108 is suitably clocked.

Analog processing block 110 post processes the analog signal produced from DSP 106 and DAC 108. Analog processing block 110 may again be formed of a variety of active and passive analog components, and may for example, act as one or more of an analog mixer, filter, demultiplexer/multiplexer, amplifier, clipper, automatic gain control circuit, or the like. The output of analog processing block 110 provides an analog output at output 111 of circuit 100.

In order to allow testing, circuit 100 further includes built-in test circuit including a digital test signal generator 124 in communication with the signal path downstream of DSP core 106, and a digital test signal comparator 126, located upstream of digital signal generator 124, and downstream of ADC 104. Further, output 111 is interconnected to analog input 101 in feedback, by way of switch 120 and a further analog processing block 122. Components 120, 122, and 124 may be formed wholly or partially on (or off) the integrated circuit embodying the remainder of circuit 100.

Analog test signals, which may for example be sine waves, may be digitally generated by circuit 100 to be processed and sent back into the part under test where the results will be measured using the DSP core 106 to compare to expected values such as those for power levels, distortion, or gain. An output signal is generated at test output 130 to indicate a pass or failure based on values loaded into memory. Output may be generated to gather statistical data.

In alternate embodiments, characteristics of the received signal may be computed by signal comparator 126. For example, signal comparator 126 may determine the presence of a signal or of a certain characteristic of the received signal. For example, signal comparator 126 may determine whether or not a signal is present at certain frequencies; the SNR of the received signal; and/or a signal distortion ratio (SDR) by measuring signal levels at specific frequencies; or the power of the received signal.

In normal operation, circuit 100 functions in much the same manner as circuit 10. Analog signal received at line 101 is processed in analog domain by an analog processing block 102. The analog signal provided by block 102 is provided to ADC 104 to produce a digital representation of the output of analog processing block 102. This digital representation is fed to digital signal processing core 106 that manipulates the digital signal in the digital domain. The processed digital signal is then provided to DAC 108. The analog output of DAC 108 is provided to an analog processing block 110. Analog processing block 110 provides the desired signal output at output line 111. In this mode of operation, switch 120 is maintained in its open position. Analog processing block 102, ADC 104, DSP core 106 and DAC 108 may perform the functions of circuit 100 in normal operation. For example, circuit 100 may be a component of a television tuner or demodulator, as for example detailed in U.S. Provisional Patent application No. 61/294,092.

In a second—test—mode of operation, switch 120 is closed and a digital signal generator 124 provides (or injects) a digital test signal to digital to analog block 108. The second—test mode—may be initiated by applying an external test enable signal. Test signal generator 124 may be clocked to provide a digital test signal at the rate expected by DAC 108. At the same time, no external input signal is provided to input 101. The injected digital signal generated by test signal generator 124 is then converted to analog form by DAC 108. Again, analog processing block 110 further processes the analog equivalent of the digital signal in the analog domain.

Now, in this test mode, analog processing block 122 is selectively connected in feedback between output 111 and input 101 by switch 120, and provides a further processed version of the analog signal to input 101 of circuit 100. This analog signal is further processed by analog processing block 102. The output of analog processing block 102 is fed to ADC 104 that in turn, feeds test signal comparator 126.

In the depicted embodiment, signal comparator 126 is located upstream of DSP core 106. However, a person of ordinary skill will readily appreciate that test signal comparator could be located downstream of DSP core 106. If located upstream of DSP core 106, as illustrated in FIG. 2, comparator 126 receives or intercepts the output of analog to digital converter 104 in the second mode of operation. Signal comparator 126 compares the digital signal provided by analog to digital converter to an expected signal reflective of the signal provided by signal source 124, as processed by analog signal processing blocks 102, 110, and 122. In this way, signal comparator 126 can ensure that DAC 108, analog processing block 110, analog processing block 122, analog processing block 102, and ADC 104 process a known signal provided by signal generator 124 in an expected manner. In this embodiment, signal comparator 126 does account for (and therefore test) signal processing by DSP core 106. If located downstream, signal comparator 126 may also test the signal processing by DSP core 106. Of course downstream and upstream are logical concepts, and signal comparator 126 may formed as part of DSP core 106.

In an alternative embodiment, test signal comparator 126 may be interconnected with an output of DSP core 106, downstream of DSP core 106. In this embodiment, test signal comparator 126 tests the operation of DSP core 106.

Signal comparator 126 may be formed in many ways, and may form a comparison metric between a signal actually received at comparator 126, and a signal expected at comparator 126. As noted, comparator 126 may calculate any one of a number of metrics to identify the quality of the resulting digital signal.

Signal comparator 126 may, for example, calculate one or more of third order inter-modulation products (IM3); signal to distortion ratios (SDR); second order distortion products; and/or signal to noise ratios (SNR) of the received signal.

As illustrated, test signal generator 124 and test signal comparator 126 are illustrated as functional blocks, external to DSP core 106. As will be appreciated, these could easily be integrated into DSP core 106. Of course many other ways of forming test signal generator/comparator 124/126 will be known to those of ordinary skill in the art.

Optionally, integrated circuit 100 could further include functional blocks to represent a test sequence of symbols in memory 140 over multiple test intervals to further ensure proper function of integrated circuit 100.

As will be appreciated, integrated circuit 100 may be formed and manufactured in conventional ways. For example, a specific integrated circuit 100 may be formed as an application specific integrated circuit (ASIC) using suitable electronic system-level (ESL); RTL design and physical design tools. Integrated circuit 100 could further be integrated with other digital, analog or mixed signal circuits.

Figure 3:
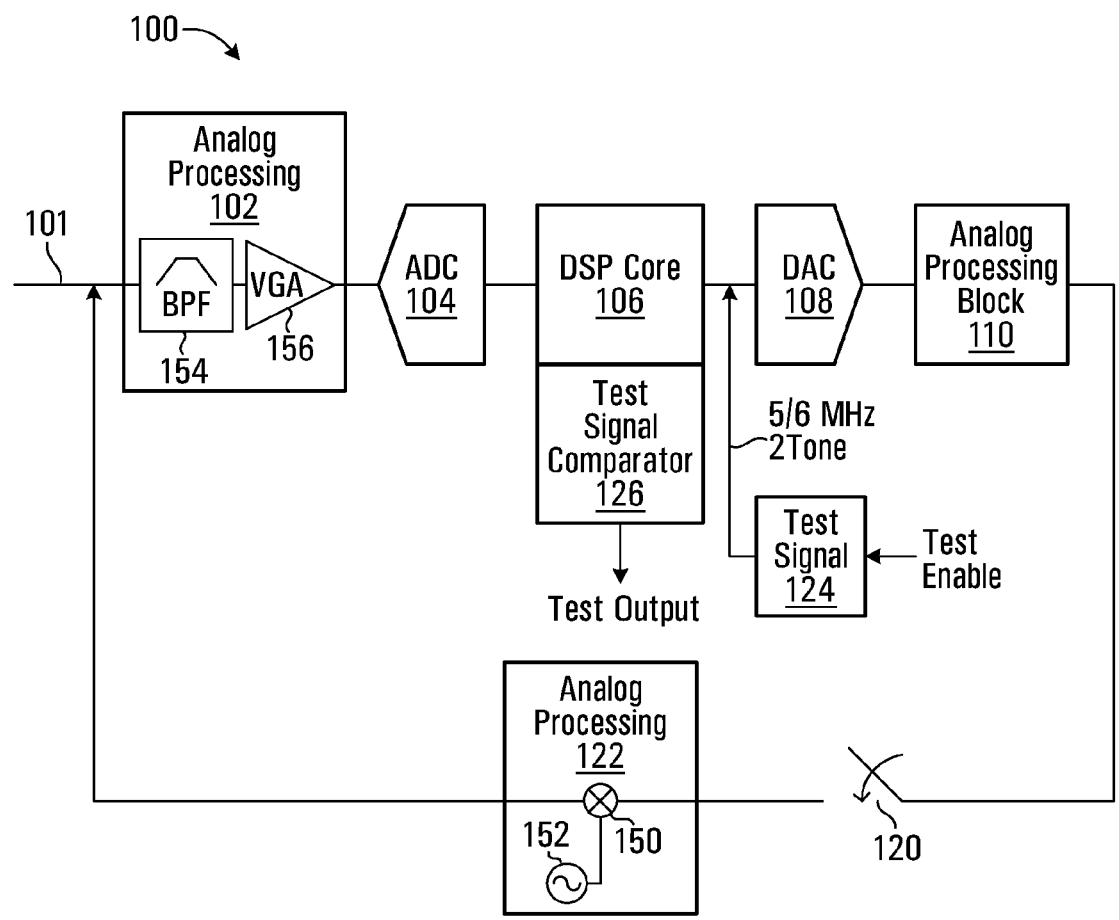
FIG. 3 is a simplified schematic diagram of a specific mixed signal integrated circuit, exemplary of an embodiment of the present invention.

In a specific example embodiment depicted in FIG. 3, circuit 100 may take the form of television tuner component, as for example disclosed in U.S. Provisional Patent Application No. 61/294,092, the contents of which are hereby incorporated by reference. In this embodiment, circuit 100 is designed to receive and process a television channel tuned to an intermediate frequency. The intermediate frequency may for example be at 36 MHz. The television channel is typically band-limited to 8 MHz. The television channel may be an NTSC, PAL, SECAM, DV-B or similar television channel.

In this embodiment analog processing block 102 may include a band-pass filter 154 and a fixed gain amplifier 156, as illustrated.

Exemplary of an embodiment of the present invention, test signal generator 124 is formed to produce a two tone signal—to be mixed in the analog domain, by a mixer 150 formed as part of analog processing block 122. Analog processing block 150 further includes a local oscillator 152 to provide a mixing frequency. The resulting mixed signal resembles a channel tuned to an intermediate frequency. In this embodiment, test signal comparator 126 further includes an SNR meter that may be formed as part of DSP core 106.

In the depicted embodiment, test signal generator 124 may form a 5/6 MHz two tone test signal, and local oscillator 152 may provide a 28 MHz mixing signal. As noted, test signal generator 124 may be formed wholly or partially on (or off) the integrated circuit embodying the remainder of circuit 100.

Now in test mode, switch 120 is closed, and test signal generator 124 generates the two tone signal. Local oscillator 152 generates a 28 MHz signal, and provides it to mixer 150. Mixer 150 further receives an analog signal corresponding to the test signal (as formed by DAC 108) produced by test signal generator 132.

The mixed signal, will include components at 28±5 MHz (33 MHz); 28±6 MHz (34 MHz). The mixed signal may also include components of harmonics and beats of the test signals and their harmonics. For example, the mixed signal may include components at 28±(5+6) MHz; 28±(2*5−6); and 28±(2*6−5).

Image signals at 28−5 MHz; 28−6 MHz; 28−(5+6) MHz; 28+(2*5+6) MHz; 28+(2*6+5) MHz; and 28−(2*5−6) may be filtered by band pass filter 154.

As such, ADC 104 may receive signals at 28+5 MHz=33 MHz; 28+6 MHz=34 MHz 28+(5+6) MHz=39 MHz; 28+ (2*5−6)=32 MHz; and 28+(2*6−5)=35 MHz.

As may now be appreciated, the resulting mixed signal resembles, in some ways, a television carrier signals tuned to an intermediate frequency. Conveniently, using a 28 MHz mixing frequency with signals at 5 and 6 MHz yields output frequencies around 36 MHz as input signals to the demodulator which, in turn, generate distortion products inside the bandwidth of interest so that they can be easily measured by the DSP 106.

Now, test signal comparator 126 may measure power at 32/33/34/35 and 39 MHz and calculate third order intermodulation products (IM3), and a signal to distortion ratio (SDR). Also, test signal comparator 126 may determine the signal to noise ratio (SNR) across an entire band of interest—for example between 32 and 40 MHz in 1 MHz intervals. If either the IM3 or SDR is too high, or the SNR across the band is too high, an error condition may be signalled, and circuit 100 may be deemed defective and discarded.

Conveniently, the cost of automated testing of circuit 100 is reduced, as test duration and the complexity of automated test equipment may be reduced. Simple test signals (like the two tone signal) generated by test signal generator 124 and complementary tests ease measurement and evaluation. Similarly, the cost of test equipment is reduced as test success and failure may be signalled by test signal comparator 126.

Conveniently, a failed test may signal a failing component. Performance levels need not be measured. This further relaxes the precision requirement in testing to one which is sufficient to determine when operation is outside the expected design bounds indicating that a manufacturing failure has occurred.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A mixed signal integrated circuit comprising:
   an input analog pre-processing block configured to receive an input analog signal at an input and configured to perform analog pre-processing on an analog input signal having a first set of specified characteristics, and with analog processing block configured to output a pre-processed input analog signal;
   an analog to digital converter (ADC), coupled to the input analog processing block, configured to convert the pre-processed input analog signal to an input digital signal;
   a digital signal processing (DSP) core, coupled to the digital converter, to process said input digital signal to provide a digitally processed digital signal having a second set of specified characteristics;
   a digital to analog converter (DAC), coupled to DSP core, to convert said digitally processed digital signal to an output analog signal, with the analog output signal having the second set of specified characteristics;
   an output analog post-processing block configured to receive the analog output signal at an input and configured to post-process a received analog signal having the second set of characteristics and to output the analog output signal at an output;
   a self test circuit comprising:
   a digital signal generator for generating a digital test signal having the second set of characteristics to be provided to said DAC;
   a feedback loop to selectively connect said output to said input in feedback and with the feedback loop having an analog processing block to convert the analog output signal having the second set of characteristics to an analog input signal having the first set of characteristics; and
   a digital signal comparator to compare a digital signal downstream of said ADC to an expected digital signal resulting from said digital test signal.

2. The mixed signal integrated circuit of claim 1 wherein said digital signal comparator compares a digital signal upstream of said digital signal processing core to said expected digital signal.

3. The mixed signal integrated circuit of claim 2 wherein said digital signal comparator sums errors between said expected signal and said received digital signal over a test interval.

4. The mixed signal integrated circuit of claim 1 further comprising a test enable input, and wherein said digital signal generator generates said digital test signal in response to a signal at said test enable input.

5. The mixed signal integrated circuit of claim 1 wherein said digital signal comparator compares said digital signal downstream of said ADC to an expected digital signal resulting from said digital test signal in response to said test enable input.

6. The mixed signal integrated circuit of claim 5 wherein said digital signal comparator measures signal to noise levels.

7. The mixed signal integrated circuit of claim 1 wherein said signal source comprises a two tone signal generator.

8. The mixed signal integrated circuit of claim 6 wherein said digital signal comparator measures at least one of third order intermodulation products and second order distortion products of said two-tone signal.

9. The mixed signal integrated circuit of claim 6 wherein said digital signal comparator measures a signal to distortion ratio.

* * * * *